United States Patent [19]

Ueda et al.

[11] Patent Number: 5,334,872
[45] Date of Patent: Aug. 2, 1994

[54] ENCAPSULATED SEMICONDUCTOR DEVICE HAVING A HANGING HEAT SPREADING PLATE ELECTRICALLY INSULATED FROM THE DIE PAD

[75] Inventors: Tetsuya Ueda; Osamu Nakagawa, both of Itami, Japan

[73] Assignee: Mitsubishi Denki Kabushiki Kaisha, Tokyo, Japan

[21] Appl. No.: 62,567

[22] Filed: May 18, 1993

Related U.S. Application Data

[63] Continuation of Ser. No. 807,652, Dec. 16, 1991, abandoned, which is a continuation of Ser. No. 572,541, Sep. 5, 1990, abandoned.

[30] Foreign Application Priority Data

Jan. 29, 1990 [JP] Japan ................. 2-16127

[51] Int. Cl.$^5$ ............. H01L 23/48; H01L 23/28; H01L 23/02; H01L 27/54
[52] U.S. Cl. .................. 257/675; 257/666; 257/713; 257/717; 257/787; 257/796
[58] Field of Search ............. 357/70, 75, 81; 257/716, 706, 796, 712, 713, 717, 723, 666, 670, 674, 675, 676, 787

[56] References Cited

U.S. PATENT DOCUMENTS

| | | | |
|---|---|---|---|
| 3,930,114 | 12/1975 | Hodge | 257/675 |
| 4,714,952 | 12/1987 | Takekawa et al. | 357/75 |
| 4,864,384 | 9/1989 | Boudot et al. | 357/81 |
| 4,887,149 | 12/1989 | Romano' | 357/81 |
| 4,926,242 | 5/1990 | Itoh et al. | 357/81 |
| 4,994,895 | 2/1991 | Matsuzaki et al. | 357/72 |
| 5,041,902 | 8/1991 | McShane | 257/706 |
| 5,053,855 | 10/1991 | Michli et al. | 357/81 |

FOREIGN PATENT DOCUMENTS

| | | | |
|---|---|---|---|
| 3635375 | 4/1988 | Fed. Rep. of Germany | 257/716 |
| 57-84157 | 5/1982 | Japan | 257/796 |

*Primary Examiner*—Sara W. Crane
*Assistant Examiner*—Carl Whitehead, Jr.
*Attorney, Agent, or Firm*—Leydig Voit & Mayer

[57] ABSTRACT

A packaged semiconductor device includes a semiconductor chip having first and second surfaces, a plurality of electrodes formed on the first surface of the semiconductor chip, a die pad bonded to the second surface of the semiconductor chip for supporting the semiconductor chip, a plurality of leads having first and second ends, the first ends being connected to corresponding electrodes of the semiconductor chip, a heat spreading plate disposed in opposed relation to the die pad and having an area larger than that of the die pad, at least one end portion of the heat spreading plate lying in the same plane as the second ends of the plurality of leads, and a resin package body encapsulating the semiconductor chip, the die pad, the first ends of the plurality of leads, and the heat spreading plate.

6 Claims, 14 Drawing Sheets

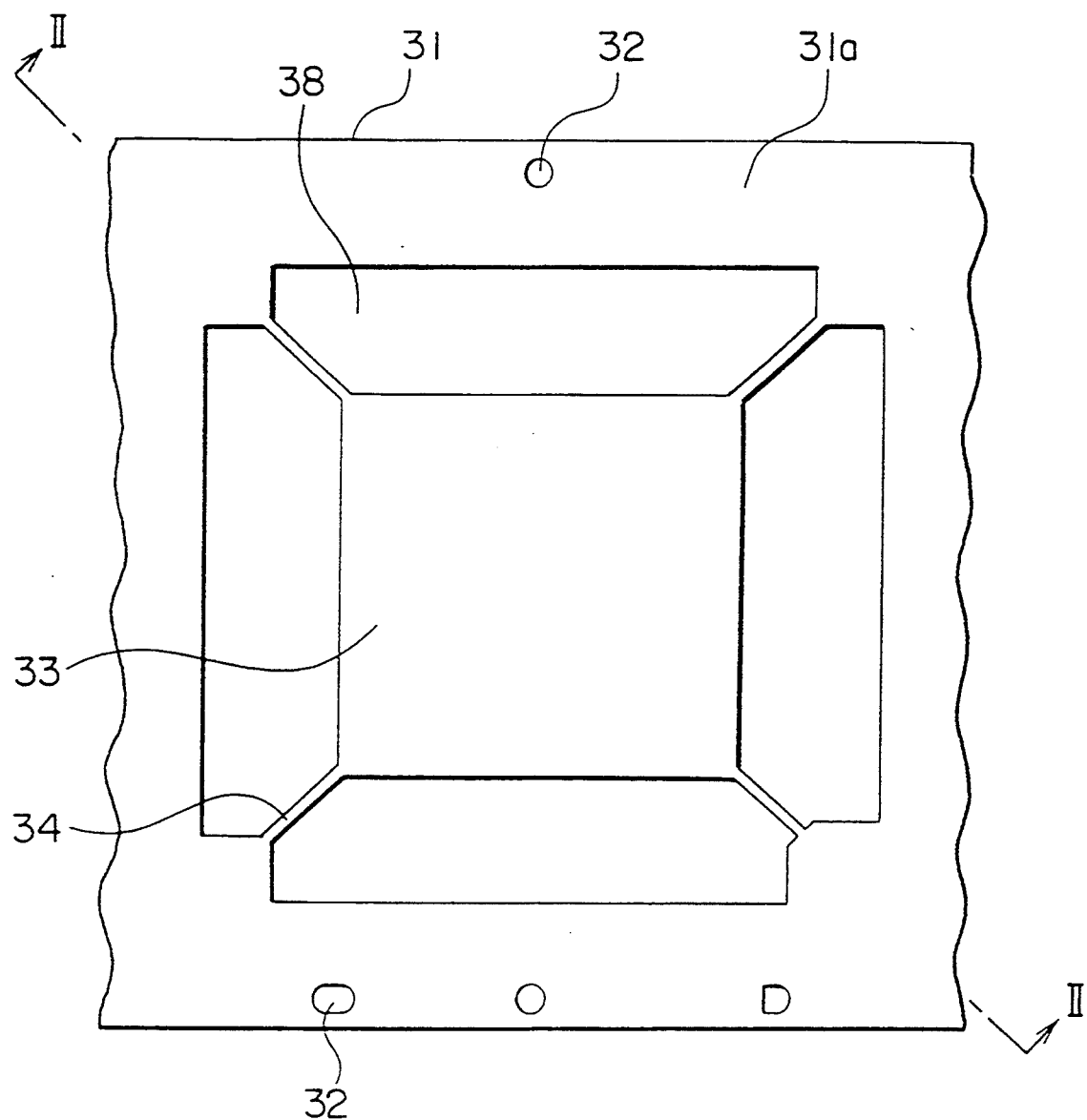

ENCAPSULATED SEMICONDUCTOR DEVICE HAVING A HANGING HEAT SPREADING PLATE ELECTRICALLY INSULATED FROM THE DIE PAD

This application is a continuation of application Ser. No. 07/807,652, filed Dec. 16, 1991 now abandoned, which is a continuation of application Ser. No. 07/577,541, filed Sep. 5, 1990 now abandoned.

BACKGROUND OF THE INVENTION

Field of the Invention

The present invention relates to a packaged device which employs a leadframe and a method of manufacturing the same, and more particularly, to an improvement in the heat radiation of the packaged semiconductor device.

Description of the Related Art

FIG. 15 is a plan view schematically showing a conventional leadframe 1. The leadframe 1 has a plurality of units 1b which are interconnected by an outer frame 1a. The units 1b are separated from each other after the molding to form individual semiconductor devices. As shown in FIG. 16, each unit 1b has a die pad 5 supported from the outer frame 1a through hanging leads 6. In the vicinity of the die pad 5, a large number of inner leads 3 are disposed. The proximal end portion of each inner lead 3 is connected to the outer frame 1a through a corresponding outer leads 4. The adjacent outer leads 4 are connected by tie bars 7. A positioning hole 2 used to position the lead frame 1 is formed at each side of the outer frame 1a of the unit 1b.

A slit 10 is formed between the adjacent units 1b to absorb warpage of the leadframe 1 which may be caused by the difference in the linear expansion coefficients between the molding resin and the material of the leadframe 1.

A packaged semiconductor device is manufactured using the above-described leadframe 1 in the manner described below. First, a semiconductor chip 15 is bonded on the die pad 5 of the leadframe 1 by a bonding agent 16, and electrode pads (not shown) formed on the surface of the semiconductor chip 15 are connected to the corresponding inner leads 3 by means of wires 17, as shown in FIG. 17. Next, the leadframe 1 is placed between a pair of molds (not shown), and a molding resin is then injected into the mold cavity through a gate indicated by a reference number 9 in FIG. 16 to seal with resin the portion of the leadframe-chip assembly defined by a molding line 8. Thereafter, the outer leads 4 are separated from the outer frame 1b and the tie bars 7 are thereby removed, and the leads are then processed to obtain a molded semiconductor device shown in FIG. 17. A reference numeral 12 denotes a molding resin.

The semiconductor chip 15 dissipates heat when operated. The heat emanating from an upper surface 15a of the semiconductor chip 15 is directly transmitted to the molding resin 12, and the heat emanating from a lower surface 15b is first transmitted to the die pad 5, and then to the molding resin 12 before it is finally released externally.

Recently, the number of devices per semiconductor chip and the performance of these devices have been rapidly increasing. Such semiconductor chips dissipate a large amount of heat. Hence, heat radiation of the packaged semiconductor device must be considered. However, the molding resin 12 has a relatively low coefficient of thermal conductivity, and a desired heat radiation cannot therefore be obtained in the conventional molded semiconductor device.

Compared with the molding resin 12, the die pad 5 formed of a metal or the like has a high coefficient of heat transmission. Hence, the use of a die pad 5 having a large area increases the heat radiating area through which the heat emanating from the lower surface 15b of the semiconductor chip 15 is released, thereby improving heat radiation of the packaged semiconductor device. However, the die pad 5 must be disposed on the inner side of the forward ends of the inner leads 3, as shown in FIG. 16, and it is therefore difficult to use a large die pad 5.

SUMMARY OF THE INVENTION

The present invention is directed to eliminating the aforementioned problem of the conventional packaged semiconductor device, and has an object of providing a packaged semiconductor device which exhibits excellent heat radiation and a method of manufacturing the same.

To this end, the present invention provides a packaged semiconductor device which includes a semiconductor chip having first and second surfaces, a plurality of electrodes formed on the first surface of the semiconductor chip, a die pad bonded to the second surface of the semiconductor chip for supporting the semiconductor chip, a plurality of leads having first and second ends, the first ends being respectively connected to corresponding electrodes of the semiconductor chip, a heat spreading plate disposed in opposed relation to the die pad, the heat spreading plate having an area larger than that of the die pad and distal end portions at least one distal end portion of the heat spreading plate lying in the same plane as the second ends of the plurality of leads, and a resin package body sealing the semiconductor chip, the die pad, the first ends of the plurality of leads and the heat spreading plate. the second ends of the plurality of leads lying in a plane adjacent to the resin package body The present invention also provides a method of manufacturing a packaged semiconductor device which comprises the steps of placing a semiconductor chip on a die pad of a leadframe, electrically connecting a plurality of electrodes formed on the semiconductor chip to respective inner leads of the leadframe, placing the lead frame on a heat spreading frame having a heat spreading portion having an area larger than that of the die pad such that the heat spreading portion is opposed to the die pad and engaging a peripheral portion of the heat spreading portion of the heat spreading frame with the leadframe, and sealing with resin the semiconductor chip, the die pad, the plurality of inner leads and the heat spreading portion.

BRIEF DESCRIPTION OF THE DRAWINGS

FIG. 4 is a plan view of a heat spreading frame employed in the first embodiment;

DESCRIPTION OF THE PREFERRED EMBODIMENTS

Embodiments of the present invention will now be described with reference to the accompanying drawings.

Figure 1:
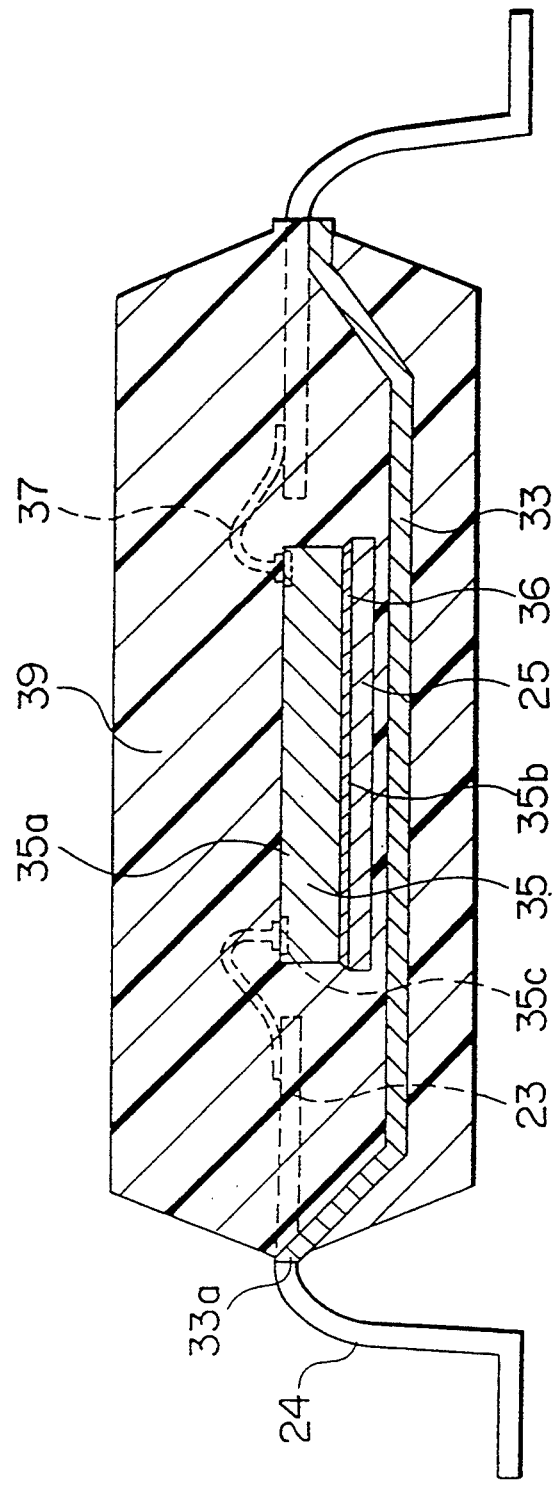
FIG. 1 is a packaged cross-sectional view of a first embodiment of a semiconductor device according to the present invention.

Referring first to FIG. 1 which shows a packaged first embodiment of the present invention, a semiconductor device has a semiconductor chip 35 having first and second surfaces 35a and 35b. The second surface 35b of the semiconductor chip 35 is bonded to the surface of a die pad 25 by a bonding agent 36. Around the semiconductor chip 35 are disposed a plurality of inner leads 23, which are integrally connected to corresponding outer leads 24. On the first surface 35a of the semiconductor chip 35 are formed a plurality of electrode pads 35c, which are connected to the corresponding inner leads 23 by means of wires 37.

A heat spreading plate 33 is disposed in opposed relation to the rear surface of the die pad 25. The heat spreading plate 33 has an area larger than that of the die pad 25. The semiconductor chip 35, the die pad 25, the inner leads 23 and the heat spreading plate 33, excluding the outer leads 24, are sealed with a sealing resin 39 which is a resin package body. At least one end portion 33a of the heat spreading plate 33 is positioned between the adjacent inner leads and in the same plane, i.e., at the same height, as that of the inner leads at the peripheral edge of the resin package body.

In this semiconductor device, whereas the heat emanating from the first surface 35a of the semiconductor chip 35 during the operation is transmitted directly to the sealing resin 39, the heat emanating from the second surface 35b of the semiconductor chip 35 is first transmitted to the die pad, and then spreads to the heat spreading plate 33 having a large area, and is finally radiated to the outside of the packaged semiconductor device efficiently through the sealing resin 39.

Figure 2:
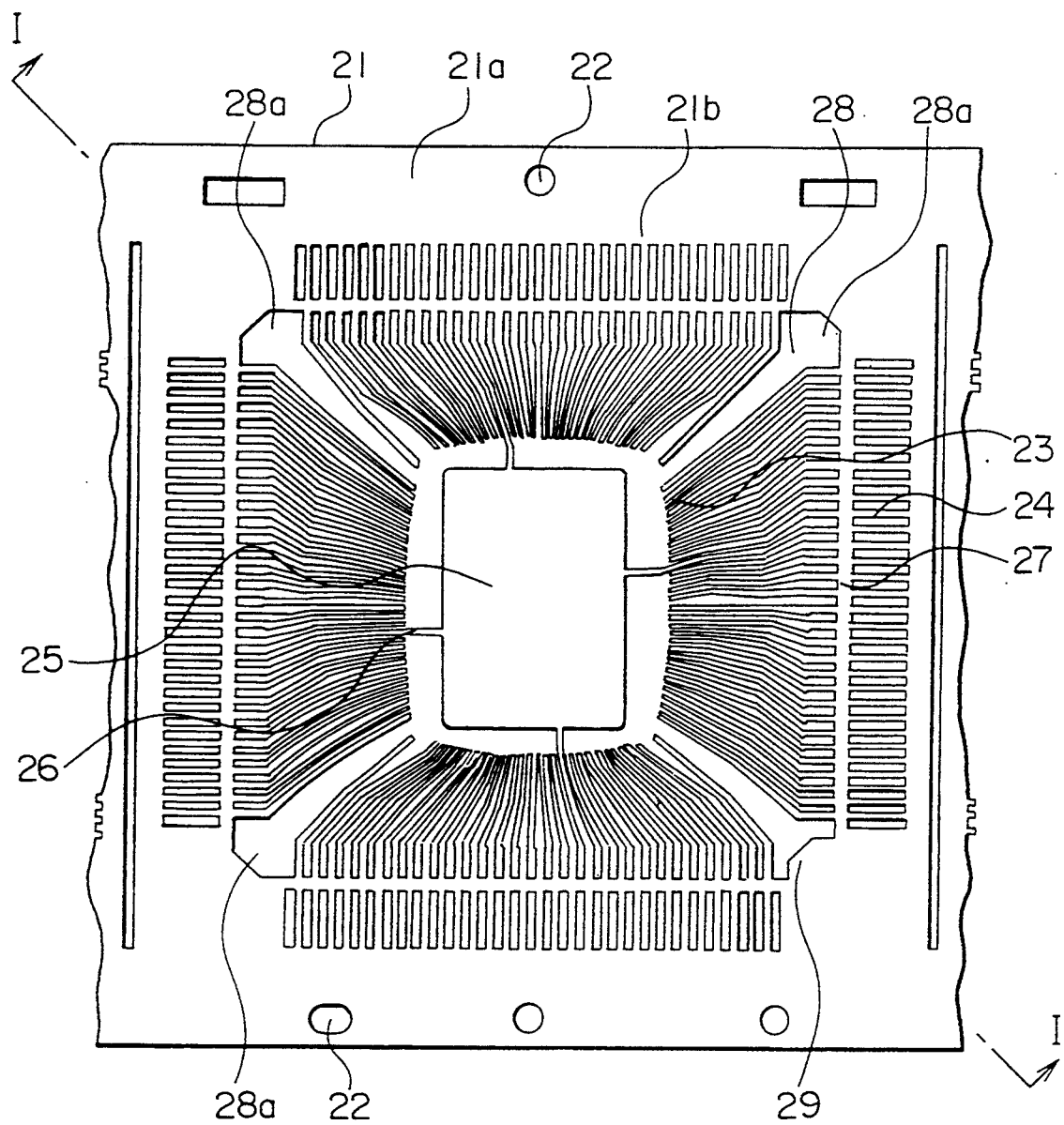
FIG. 2 is a plan view of a leadframe employed in the first embodiment.

The packaged semiconductor device described above will be manufactured in the manner described below. First, a leadframe 21 shown in FIG. 2 is prepared. The leadframe 21 has a substantially rectangular opening 28. At the center of the opening 28, the die pad 25 is supported on an outer frame 21a through hanging leads 26. Within the opening 28 are disposed a large number of inner leads 23. The inner leads protrude toward the die pad 25 from the four sides that form the opening 28. The proximal end of each inner lead 23 is connected to the outer frame 21a through the corresponding outer lead 24. The adjacent outer leads 24 are connected to each other by tie bars 27. A positioning hole 22 for positioning the leadframe 21 is formed at each side of the outer frame 21a.

On three corners of the opening 28, no inner lead 23 is formed in order to form notches 28a. On the remaining one corner, a resin guiding portion 29 for guiding a molding resin is formed in such a manner that it protrudes from the outer frame 21a.

Figure 3:
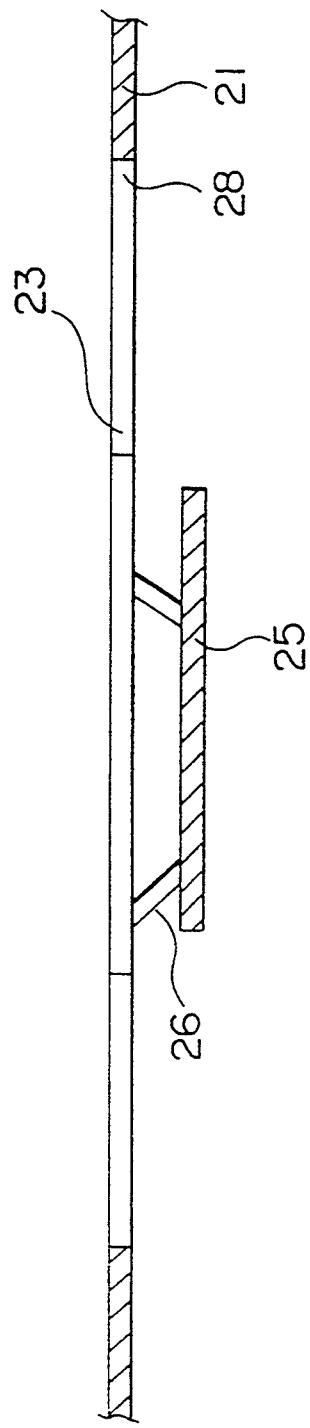
FIG. 3 is a section taken along the line I—I of FIG. 2.

As shown in FIG. 3, the die pad 25 is suspended by the hanging leads 26 at a position lower than the inner leads 23 by a predetermined distance.

Next, the heat spreading frame 31 shown in FIG. 4 is prepared. The heat spreading frame 31 has the same width as that of the leadframe 21 shown in FIG. 2 and has positioning holes 32 at the same position as that of the positioning holes 22. The heat spreading frame 31 has a substantially rectangular opening 38. At the center of the opening 38, a heat spreading plate (heat spreading portion) 33 is supported on an outer frame 31a through hanging leads 34.

Figure 5:
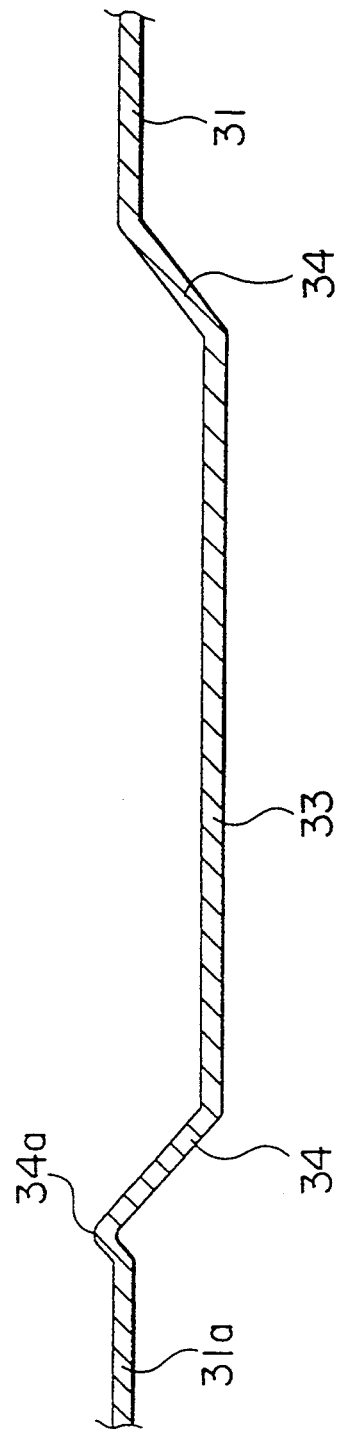
FIG. 5 is a section taken along the line II—II of FIG. 4.

Also, the heat spreading plate 33 is suspended by the hanging leads 34 at a position lower than that of the outer frame 31a by a predetermined distance, as shown in FIG. 5. Each of the hanging leads 34, which correspond to the three notches 28a of the leadframe 21, has an upward protrusion 34a which protrudes from the outer frame 31a upward.

The semiconductor chip 35 is placed on the die pad 25 with the bonding agent 36 between the second surface of the semiconductor chip 35 and the die pad 25, as shown in FIG. 1. Next, the plurality of electrode pads 35c formed on the first surface 35a of the semiconductor chip 35 are connected to the corresponding inner leads 23 of the leadframe 21 by means of the wires 37.

Figure 6:
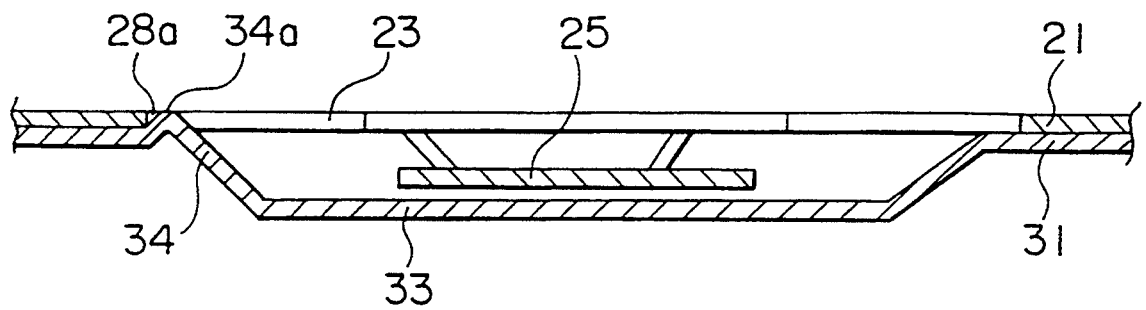
FIGS. 6, 7 and 8 are respectively cross-sectional, plan and bottom views of an assembly of the leadframe shown in FIG. 2 and the heat spreading frame shown in FIG. 4.
Figure 7:
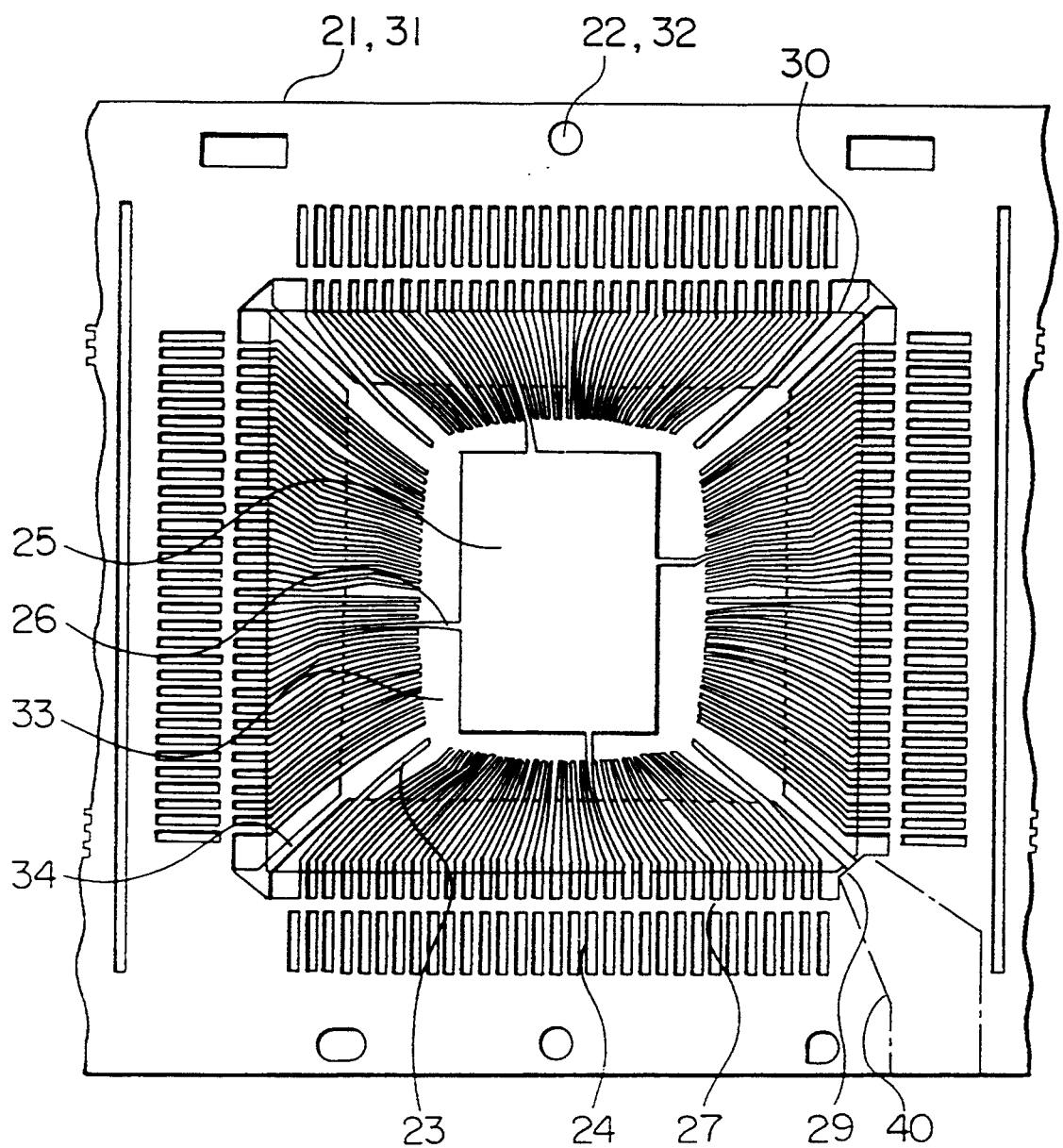
Figure 8:
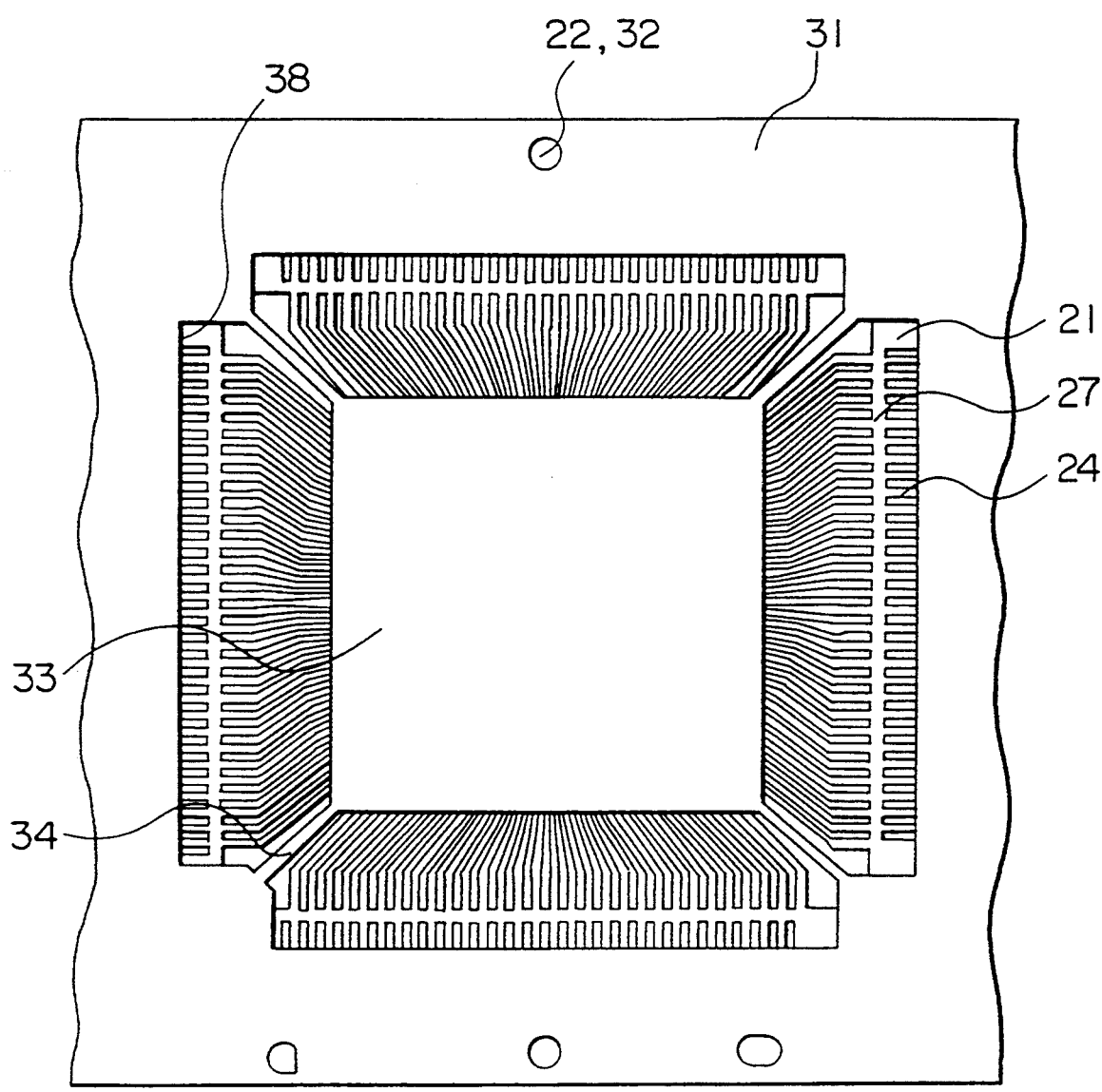

Thereafter, the leadframe 21 is placed on top of the heat spreading frame 31, as shown in FIG. 6. At that time, the heat spreading plate 33 of the heat spreading frame 31 is opposed to the die pad 25 of the leadframe 21, and the protrusions 34a of the three hanging leads 34 of the heat spreading frame 31 are fitted into the notches 28a of the leadframe 21 and are thereby located at the same plane, i.e., at the same height, as that of the leadframe 21. FIGS. 7 and 8 are respectively top and bottom views of the leadframe 21 - heat spreading frame 31 assembly in that state. In FIGS. 6 and 7, the semiconductor chip 35 is omitted. As shown in FIG. 7, the heat spreading plate 33 of the heat spreading frame 31 is larger in size than the die pad 25 of the leadframe 31 and therefore reaches under the inner leads 23. Also, as shown in FIG. 8, the opening 38 of the heat spreading frame 31 has a size which allows the portion of the leadframe 21, ranging from the inner leads 23 to the outer leads 24, to be exposed therethrough.

Figure 9:
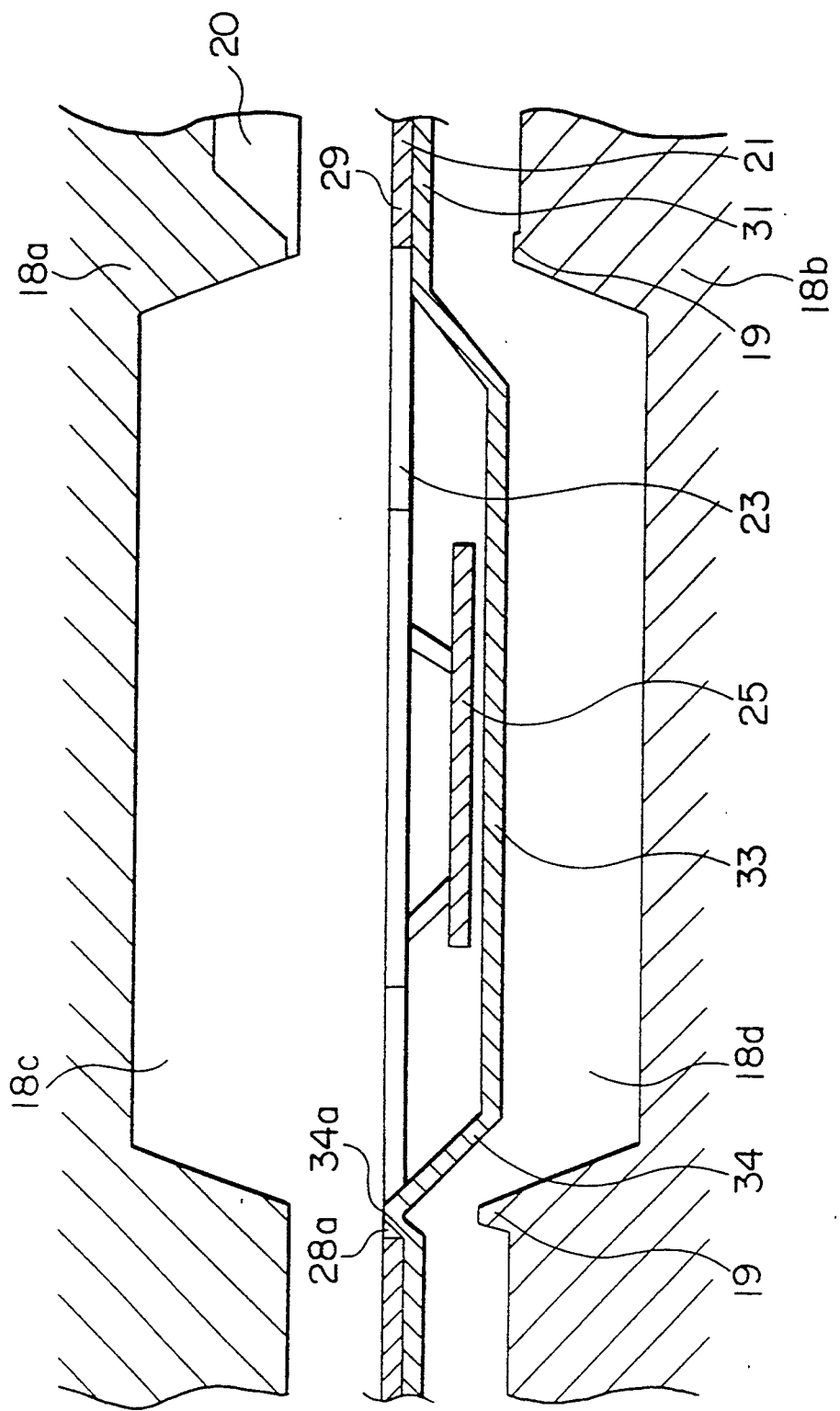
FIGS. 9 and 10 illustrate the manufacturing process of the first embodiment of the packaged semiconductor device.

The leadframe 21 - the heat spreading frame 31 assembly is placed between an upper mold 18a and a lower mold 18b both of which form a sealing mold, as shown in FIG. 9, and the mold is then closed. At that time, the heat spreading plate 33 of the heat spreading frame 31 is located in a cavity half 18d of the lower mold 18b. Also, closing portions 19, protruding toward the upper mold 18a from the peripheral edge of the cavity half 18d of the lower mold 18b, are in contact with the respective protrusions 34a of the handing leads 34 of the heat spreading frame 31 which are fitted into the notches 28a of the leadframe 21. A gate 20, which is formed in the upper mold 18a for injecting the resin therethrough, is in alignment with a portion 40 indicated by the dot-dashed line in FIG. 7. That is, the gate 20 is located above the resin guiding portion 29 of the leadframe 21.

Figure 10:
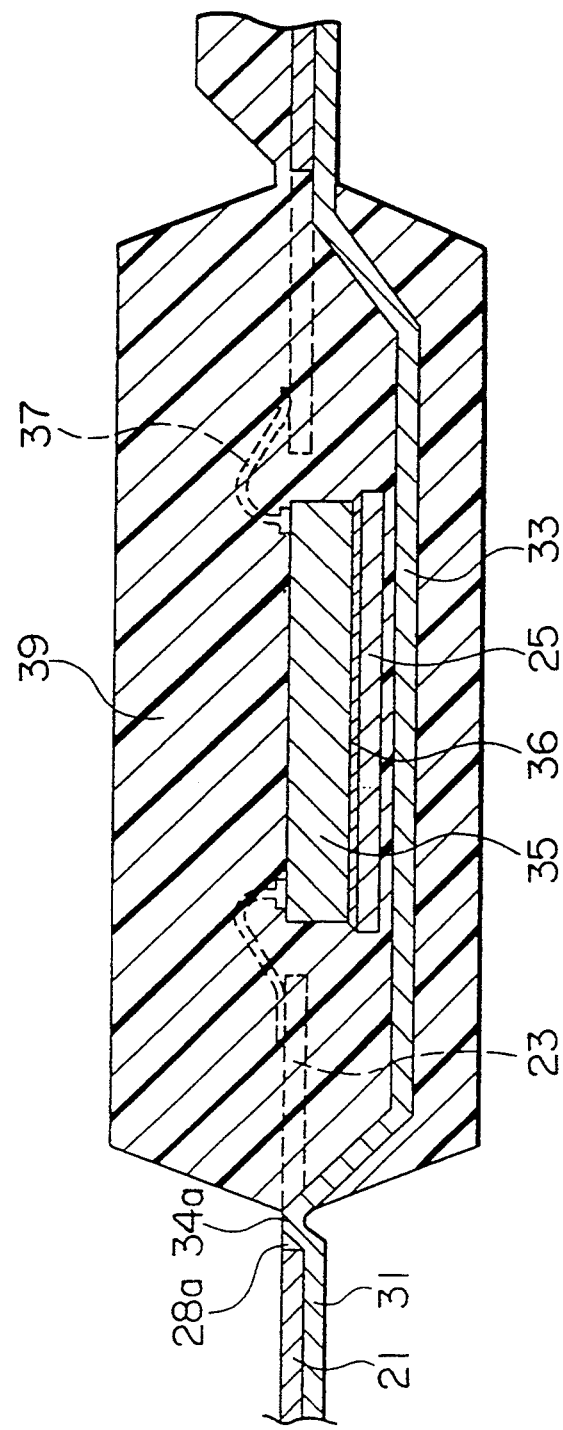

In that state, a molten resin is injected into the cavity formed by a cavity half 18c of the upper mold 18a and the cavity half 18d of the lower mold 18b from the gate 20, and is then hardened, by means of which the portion of the leadframe - heat spreading frame assembly defined by the molding line 30 in FIG. 7 is sealed with resin and a semifinished product shown in FIG. 10 is thereby obtained.

Thereafter, the semifinished product is pressed by a working mold (not shown) to cut the protrusions 34a of the hanging leads 34 of the heat spreading frame 31, separate the outer leads 24 of the leadframe 21 from the outer frame 21a, remove the tie bars 27 and bend the outer leads 24, whereby the semiconductor device with a package shown in FIG. 1 is obtained. The protrusions 34a of the hanging leads 34 of the heat spreading frame 31 which are cut form the end portions 33a of the heat spreading plate 33 shown in FIG. 1.

As stated above, since the protrusions 34a of the hanging leads 34 of the heat spreading frame 31 are cut by the working mold in a state where they are fitted into the notches 28a of the leadframe 31 and are thereby positioned at the same plane as that of the leadframe 21, a working mold which is strong enough to cut one frame can be employed, unlike the case of cutting two frames placed on top of the other. That is, the lifetime of the mold is not decreased.

Various Cu or Fe materials can be used as the material of the leadframe 21 and that of the heat spreading frame 31. The leadframe 21 and the heat spreading frame 31 may be made of the same material or different materials. It is, however, desirable that the heat spreading frame 31 is made of a material which exhibits excellent heat conductivity. From that viewpoint, a Cu frame is appropriately employed.

In the case of a semiconductor chip 35 which does not require fixing of the potential of the second surface 35b, the die pad 25 can be brought into contact with the heat spreading plate 33. This achieves further improvement of heat radiation.

Figure 11:
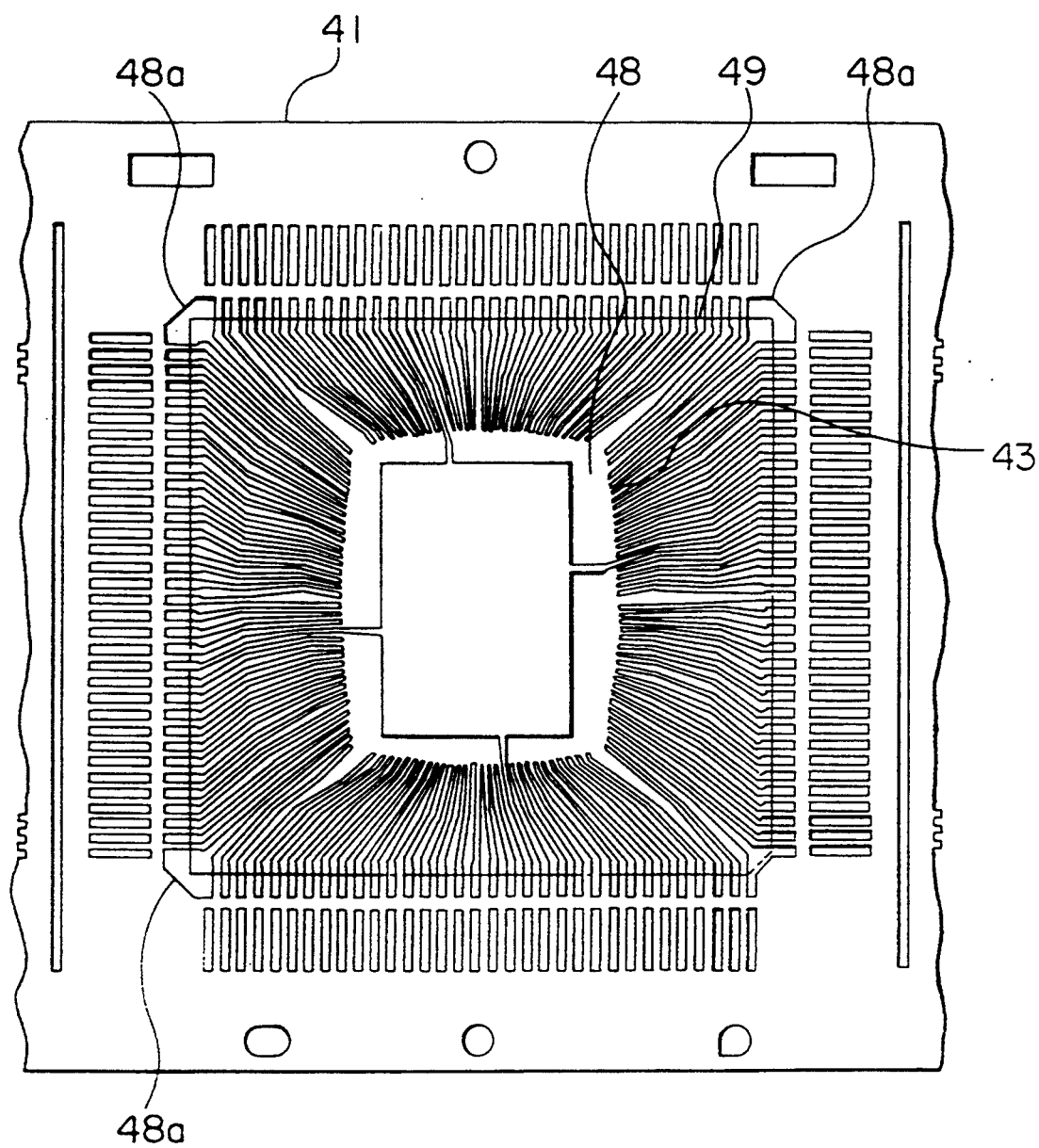
FIG. 11 is a plan view of a leadframe employed in a second embodiment of the present invention.

In the first embodiment, no inner lead 23 is provided on the four corners of the opening 28 of the leadframe 21 to form the notches 28a, as shown in FIG. 2. However, like a leadframe 41 shown in FIG. 11 which is employed in a second embodiment of the present invention, even when inner leads 43 are provided on the four corners of an opening 48, notches 48a can be formed. A dot-dashed line 49 in FIG. 11 and 59 in FIG. 12 indicates the molding line.

Figure 12:
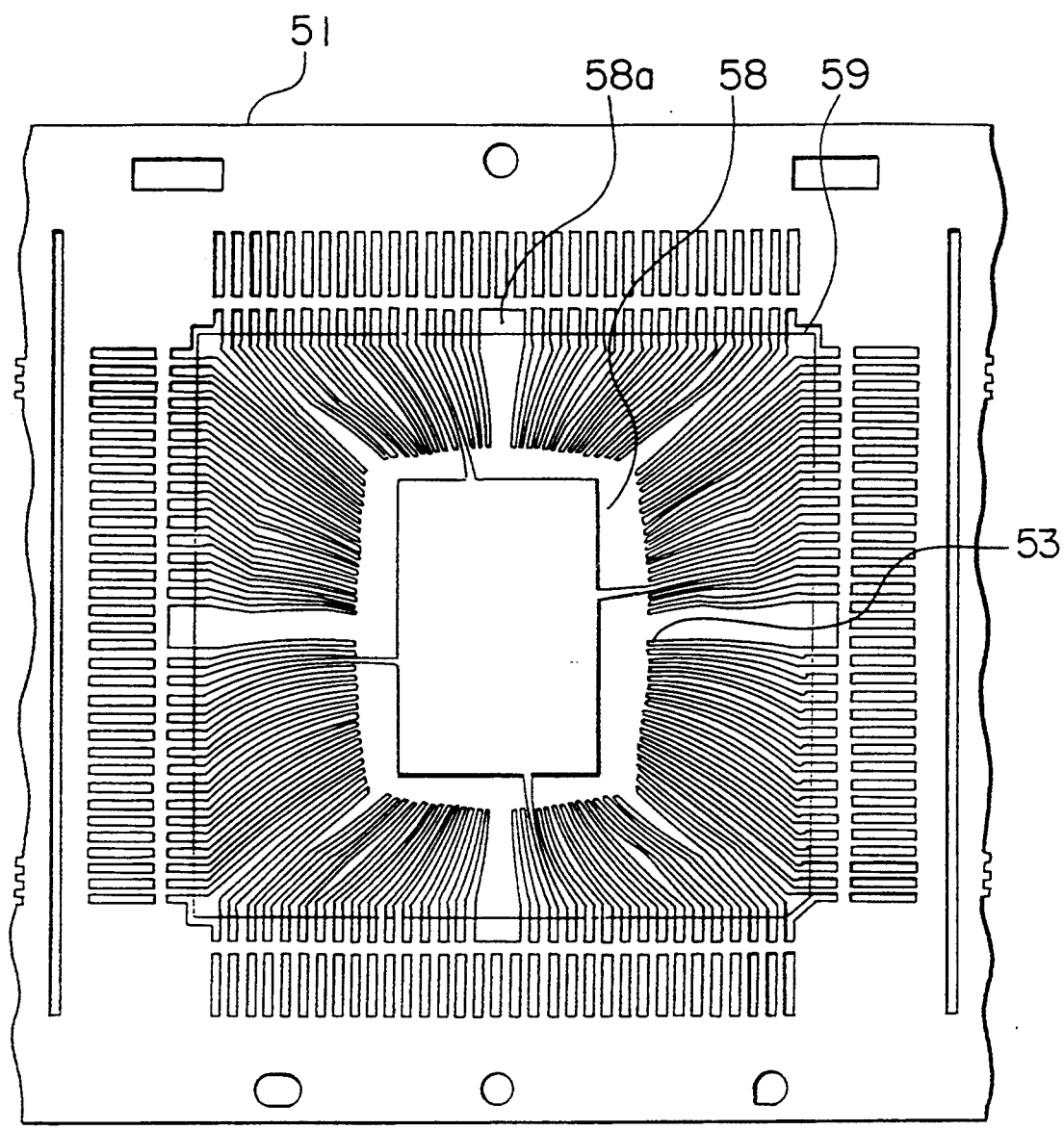
FIGS. 12 and 13 are respectively plan views of a leadframe and a heat spreading frame which are employed in a third embodiment of the present invention.
Figure 13:
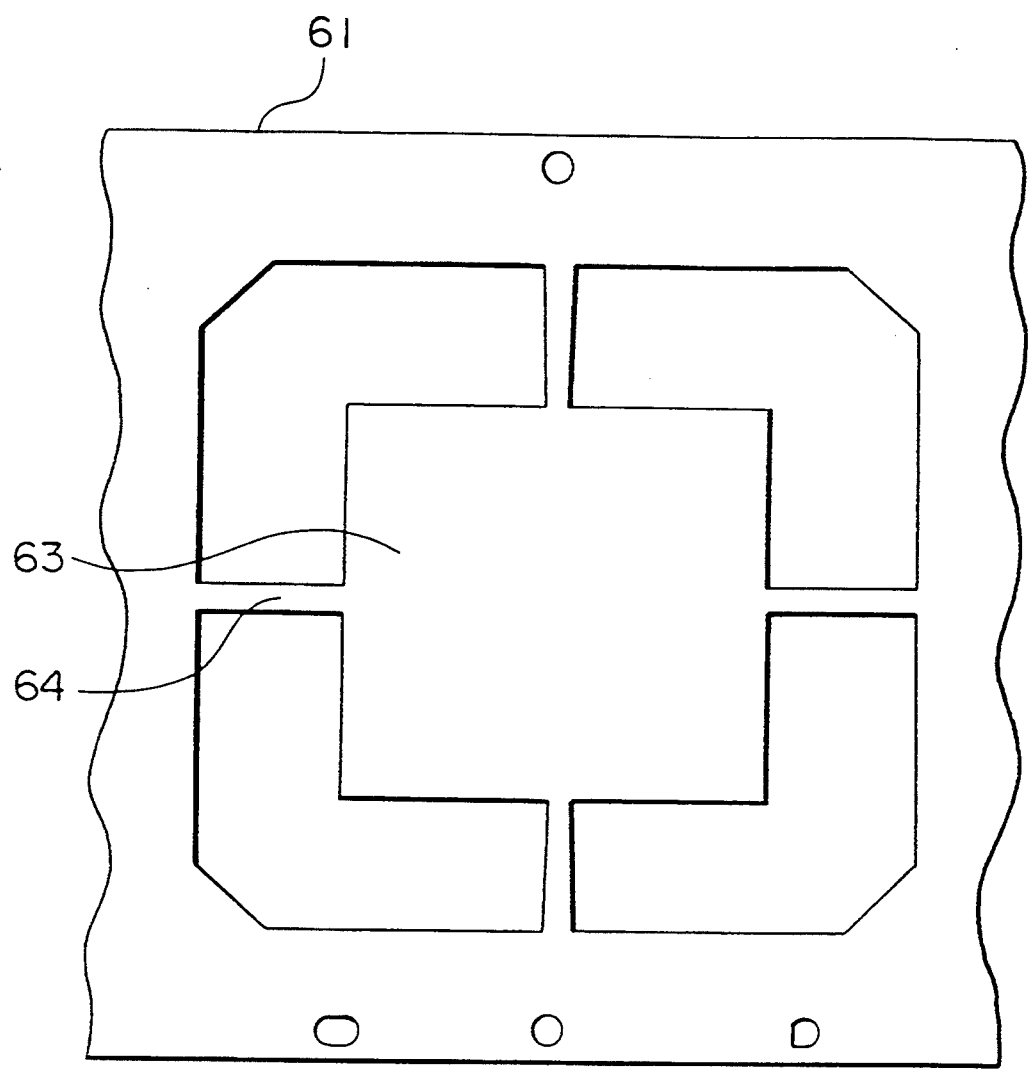
Figure 14:
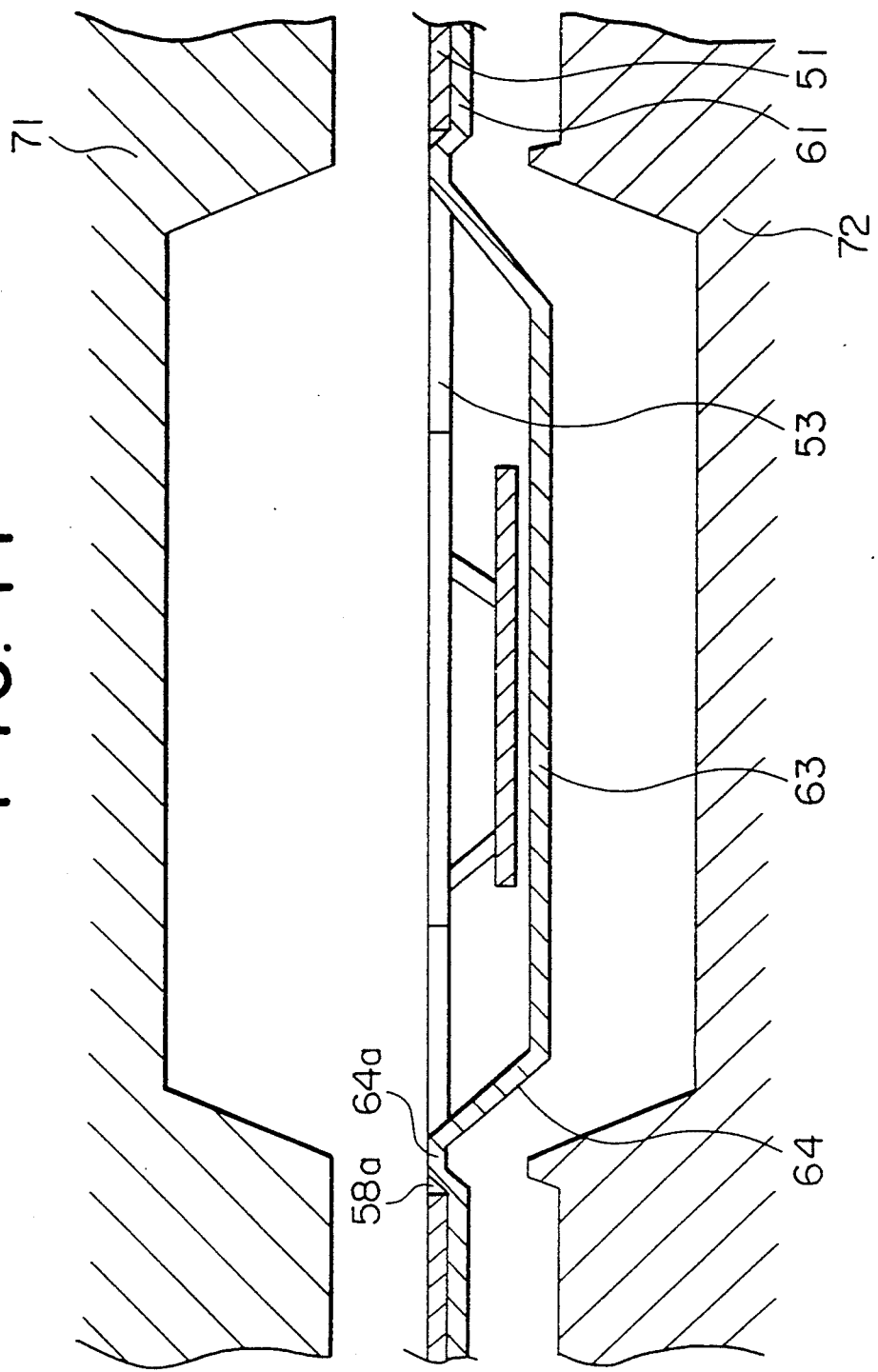
FIG. 14 is a cross-sectional view illustrating the manufacturing process of the third embodiment.
Figure 15:
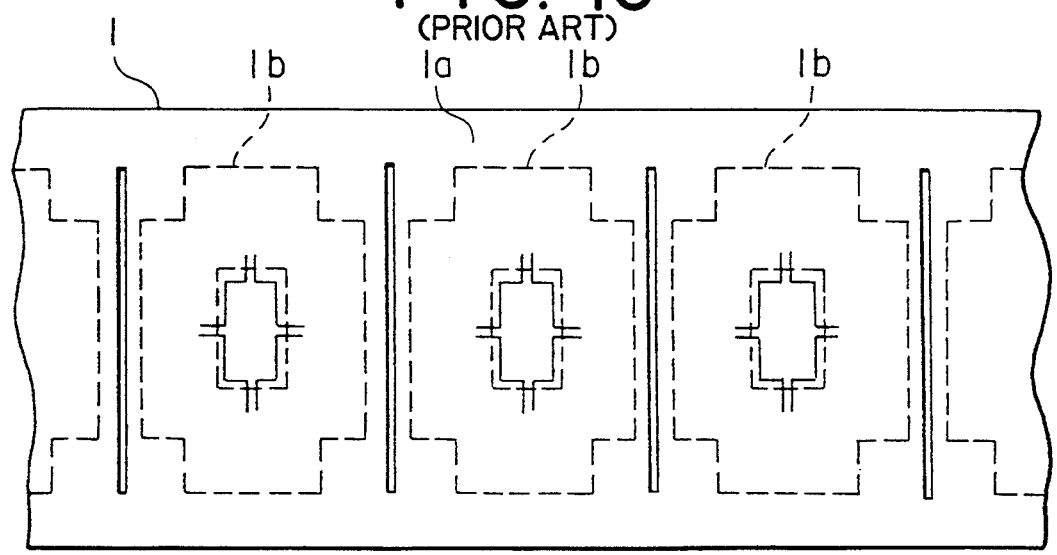
FIG. 15 is a plan view of a conventional leadframe.
Figure 16:
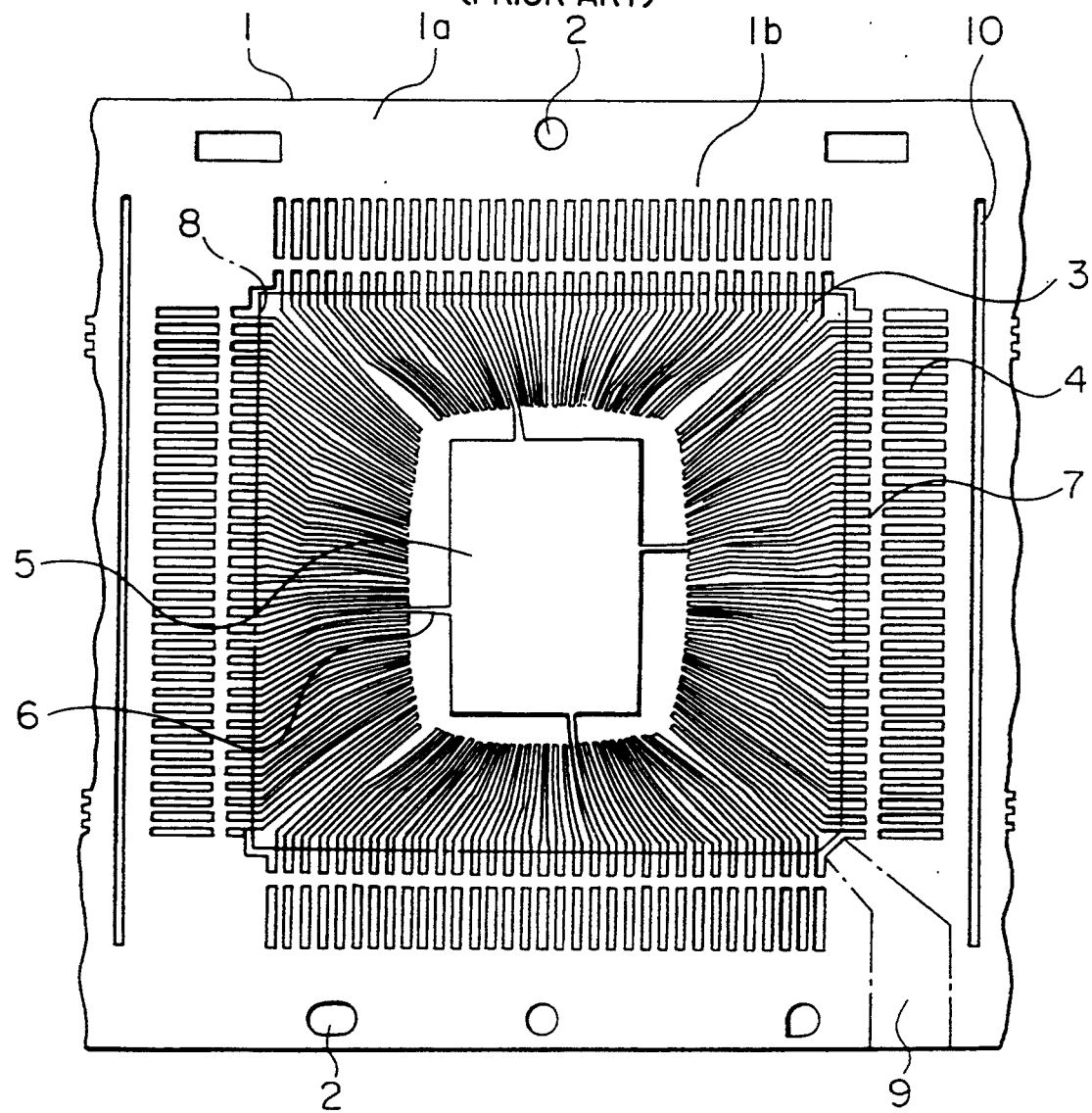
FIG. 16 is an enlarged view of the essential parts of the leadframe of FIG. 15.
Figure 17:
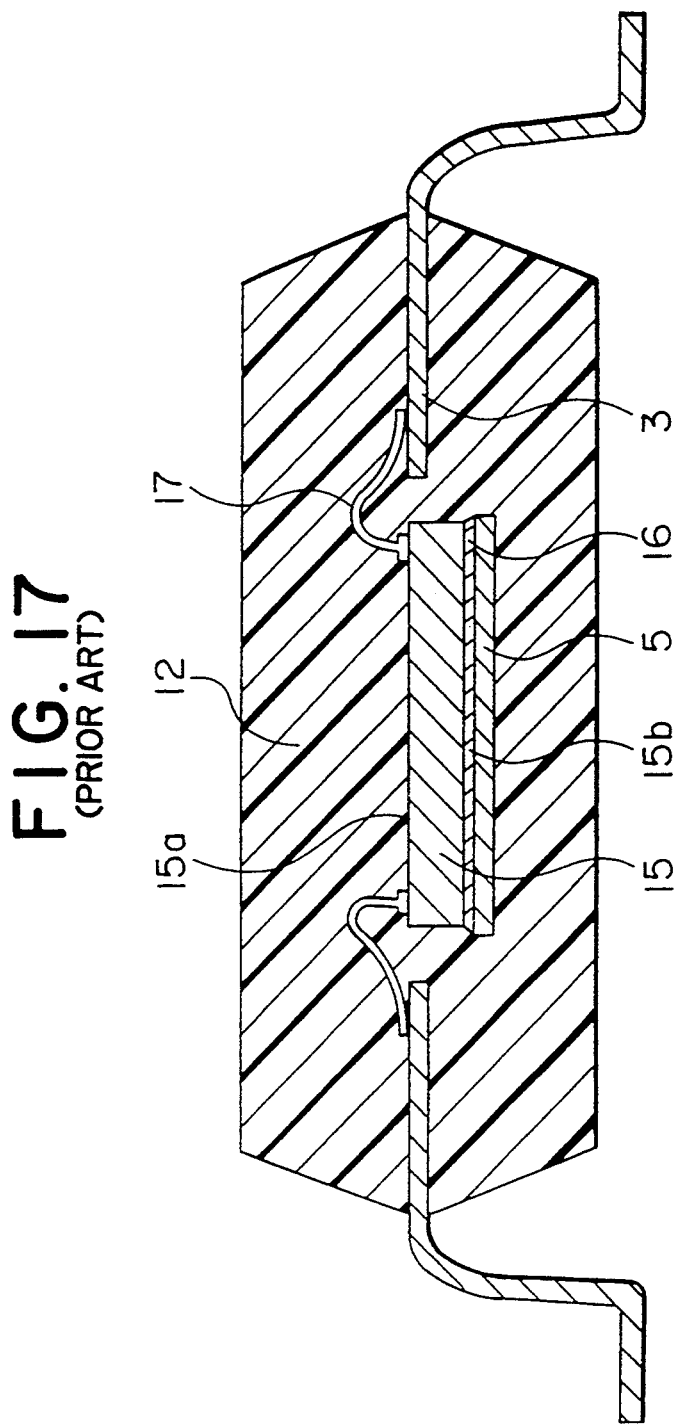
FIG. 17 is a cross-sectional view of a conventional packaged semiconductor device.

FIGS. 12 and 13 respectively show a leadframe 51 and a heat spreading frame 61, both of which are employed in a third embodiment of the present invention. In the leadframe 51, two inner leads 53, located at the center of each of the four sides that form a substantially rectangular opening 58, are removed to form a notch 58a. Hence, as shown in FIG. 13, the heat spreading frame 61 has hanging leads 64 at positions corresponding to those of the notches 58a of the leadframe 51 to suspend a heat spreading plate 63. As shown in FIG. 14, each hanging lead 64 has a protrusion 64a, which is fitted into the corresponding notch 58a of the leadframe 51 when the leadframe 51 and the heat spreading frame 61 are placed on top of the other to obtain a leadframe 51 - heat spreading frame 61 assembly. The assembly is placed between an upper mold 71 and a lower mold 72, and resin sealing of the assembly is then conducted.

Thus is manufactured a packaged semiconductor device which exhibits excellent heat radiation, like that shown in FIG. 1.

In the aforementioned embodiments, a transfer molding technique is employed to seal the semiconductor chip - leadframe assembly with resin. However, a potting technique may also be employed.

What is claimed is:
1. A packaged semiconductor device comprising:
   an electrically conducting lead frame including a plurality of connecting leads, each connecting lead having a first end and a second end, the first ends of the connecting leads lying substantially in a first plane, a die pad having an area and lying in a second plane generally parallel to and spaced from the first plane, and a plurality of first hanging leads extending from the first plane to the second plane and supporting the die pad;
   a semiconductor chip having opposed first and second surfaces and a plurality of electrodes disposed on the first surfaces wherein the second surface of the semiconductor chip is bonded to the die pad and the first ends of at least some of the connecting leads are electrically connected to corresponding electrodes;
   heat spreading plate spaced from, directly opposite, and electrically insulated from the die pad, having an area larger than the area of the die pad for dispersing heat produced by the semiconductor chip, and including a plurality of second hanging leads connected to the heat spreading plate, supporting and extending from the heat spreading plate to and terminating substantially in the first plane, the second hanging leads being respectively disposed between and electrically insulated from pairs of the connecting leads; and
   a resin package encapsulating the semiconductor chip, the die pad, the second ends of the connecting leads, the heat spreading plate, and the second hanging leads wherein a portion of the resin package is disposed between and separates the heat spreading plate from the die pad.

2. A packaged semiconductor device according to claim 1 wherein the heat spreading plate is rectangular and includes four corners and the second hanging leads are each disposed a corner of the heat spreading plate.

3. A packaged semiconductor device according to claim 1 wherein the heat spreading plate is rectangular and has four sides and the second hanging leads are each disposed a side of the heat spreading plate.

4. A packaged semiconductor device according to claim 1 wherein the heat spreading plate is metallic.

5. A packaged semiconductor device according to claim 1 wherein the die pad is disposed between the first plane and the heat spreading plate.

6. A packaged semiconductor device according to claim 1 wherein portions of the resin package electrically insulate the second hanging leads from the connecting leads, the first ends of the connecting leads extend outside the resin package, and the second hanging leads do not extend outside the resin package.

* * * * *